United States Patent [19]
Boucher et al.

[11] 4,094,764
[45] June 13, 1978

[54] DEVICE FOR CATHODIC SPUTTERING AT A HIGH DEPOSITION RATE

[75] Inventors: Bernard Boucher, Massy; Daniel Luzet, La Frette; Claude Sella, Meudon-la-Foret, all of France

[73] Assignees: Commissariat a l'Energie Atomique, Paris; Agence Nationale de Valorisation de la Recherche (ANVAR), Neuilly-sur-Seine, both of France

[21] Appl. No.: 722,472

[22] Filed: Sep. 13, 1976

[30] Foreign Application Priority Data

Sep. 19, 1975 France .................... 75 28778

[51] Int. Cl.² ............................. C23C 15/00
[52] U.S. Cl. ....................................... 204/298
[58] Field of Search ........................ 204/192, 298

[56] References Cited

U.S. PATENT DOCUMENTS

| | | | |
|---|---|---|---|
| 3,629,095 | 12/1971 | Jackson et al. | 204/298 |
| 3,669,860 | 6/1972 | Knowles et al. | 204/192 |
| 3,669,861 | 6/1972 | Cash, Jr. et al. | 204/192 |
| 3,830,721 | 8/1974 | Gruen et al. | 204/298 |
| 3,884,793 | 5/1975 | Penfold et al. | 204/298 |
| 3,922,214 | 11/1975 | VanCakenberghe | 204/298 |

FOREIGN PATENT DOCUMENTS

| | | | |
|---|---|---|---|
| 1,527,218 | 5/1968 | France | 204/298 |

OTHER PUBLICATIONS

R. W. Berry et al., "Thin Film Technology," Van Nostrand Reinhold, N.Y., 1968, pp. 230-231.

*Primary Examiner*—Aaron Weisstuch
*Attorney, Agent, or Firm*—McNenny, Pearne, Gordon, Gail, Dickinson & Schiller

[57] ABSTRACT

The target of a device for cathodic sputtering at a high deposition rate on a substrate placed within a pumped enclosure is brought to a negative potential with respect to an anode. A gas is admitted at a pressure P into the space formed between the target and the anode, a high gas-pressure gradient being established between the target and the substrate. A magnetic field H is produced in a direction parallel to the target surface located opposite to the substrate and a suppressor screen is placed around the target.

1 Claim, 8 Drawing Figures

DEVICE FOR CATHODIC SPUTTERING AT A HIGH DEPOSITION RATE

This invention relates to a device for cathodic sputtering at a high deposition rate.

Cathodic sputtering makes it possible to deposit a large number of different substances vaporized by ion bombardment onto substrates of any type.

Recent developments in cathodic sputtering are explained by the fact that this technique offers many advantages over other techniques for the deposition of films of substances on a substrate such as evaporation, deposition in the vapor phase and so forth. One of the most interesting features of the sputtering process lies in the fact that a flux of sputtered material obtained from a massive alloy can have the same composition as that of the alloy.

In cathodic sputtering devices of the diode type, a target is placed opposite to a substrate. The target is a "cathodic" target or in other words is brought to a negative potential with respect to an anode. The potential between the anode and the cathode-target is such that a continuous electric discharge exists between these two elements. The discharge ionizes the gas and the ions thus formed which are attracted by the target (at a negative potential) bombard the latter in order to sputter the constituent material of said target. This sputtered material is accordingly deposited on a substrate. Cathodic sputtering makes it possible to form new materials, compounds and alloys of complex structure which cannot be prepared by methods of thermal evaporation by reason of the many problems of decomposition and of reactivity with the crucibles.

However, the sputtering techniques employed up to the present time suffer from a limitation which is incompatible with some applications, namely relatively low deposition rates of the order of one micron in thickness per hour. While these rates are sufficient for many applications such as microelectronics, optics and the like, other fields of application call for much higher deposition rates of the order of a few tens or a few hundreds of microns per hour. This is the case in particular of certain coatings in the micro-mechanical field or for the formation of new materials in sufficiently large quantity in order to chracterize their chemical and physical properties with accuracy.

Moreover, the preparation of new materials often presents a problem in regard to the fabrication of targets of large size which are usually employed in current sputtering devices. Targets of this type are often very difficult to manufacture and very costly (on account of rare materials, the difficulty involved in obtaining a homogeneous composition, fragility and so forth).

The present invention overcomes the disadvantages attached to the above-mentioned cathodic sputtering devices of the prior art by permitting the achievement of much higher deposition rates of the order of 50 to 100 microns per hour while operating with targets of small size if necessary.

In most precise terms, the device for cathodic sputtering at a high deposition rate on a substrate in accordance with the invention includes a cathode-target which is brought to a negative potential with respect to an anode. The substrate is placed within a pumped enclosure. Said device further comprises means for admitting a gas at a pressure P into the enclosed space formed between said target and said anode. The device in accordance with the invention essentially comprises means for establishing a high gas-pressure gradient between said target and said substrate, means located externally of the target for producing a magnetic field H parallel to the surface of said target which is located opposite to said substrate, and a suppressor screen placed around the target.

In fact, since the substrate is placed within a pumped enclosure and the ionizable gas is admitted into the anode-cathode space, there exists a high pressure ratio, usually within the range of 250 to 500 and preferably in the vicinity of 100, between the pressure P in the vicinity of the target and the pressure $p$ in the vicinity of the substrate. The high pressure in the vicinity of the target results in a high ion concentration in the vicinity of said target and consequently in strong sputtering of the target by said ions. The low pressure between the anode and the substrate reduces backscattering of the sputtered particles.

The function of the magnetic field H of the order of a few kilogauss in the case of an electric field between anode and target of a few KV/cm is to produce a curved electron path. This accordingly has the effect of increasing in the vicinity of the target the probabilities of ionization of the gas and of secondary electron emissions.

In devices of the prior art of the magnetron cathode type, a magnetic field substantially parallel to the surface of the cathodic target was produced by making use of permanent magnets placed behind the target at right angles to and in contact with this latter in order to ensure that the field lines between two magnets of opposite polarity are closed in curved lines both inside and outside the materials of the target. Only the component of the field H which is parallel to the surface of the target outside the latter is effective. This type of device has a number of disadvantages: in the first place it entails the need to employ targets of large size in order to mount the magnets against these latter; secondly in the case of ferromagnetic materials, guiding of the field lines is performed almost entirely within the target, thus affecting the efficiency of the device since the effective portion of the magnetic field is located outside the target.

Further properties and advantages of the invention will become apparent from the following description of exemplified embodiments which are given by way of explanation and not in any limiting sense, reference being made to the accompanying drawings, wherein.

Figure 1:
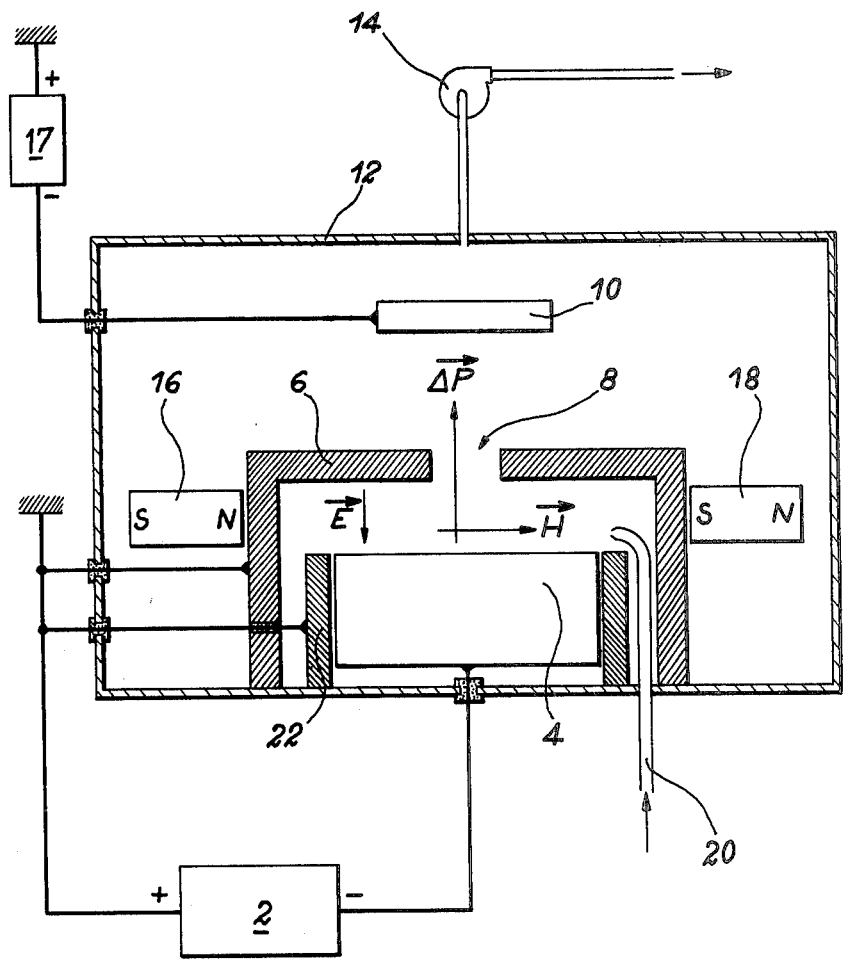
FIG. 1 is a diagram of construction of the device in accordance with the invention.

The schematic view of FIG. 1 illustrates the high-rate cathodic sputtering device in accordance with the invention and contains the main components of the device. The target 4 having a single flat sputtering surface defined by a perimetric edge is brought to a negative potential by means of the high-voltage source 2. Said target 4 is placed opposite to a cup shaped anode 6 having a bottom portion in the shape of a cylindrical ring, for example, and pierced by an aperture or orifice 8 opposite to the cathode-target 4. The substrate 10 is placed opposite to the aperture 8 and opposite to the target 4. The entire assembly is placed within an enclosure 12 which is evacuated by means of the pump 14. The device also comprises means for producing a field H parallel to the surface of the target 4, said field being produced in the case shown in FIG. 1 by two magnets 16 and 18 having oppositely-facing poles. A pipe 20 for supplying ionizable gas conveys said gas to the vicinity of the surface of the target at the pressure P.

As shown in the figure, the suppressor screen 22 is placed on each side of in the immediate proximity of the cathode target 4 and is connected electrically to the anode. It is readily apparent that the suppressor screen can be brought to a potential which is different from that of the anode.

Under the influence of the electric field E between the anode and the target, the gas introduced through the pipe 20 is ionized. The ions thus formed bombard the top surface of the target 4 and sputter the materials contained in said target 4. These sputtered materials escape through the aperture 8 of the anode 6 and are then deposited on the substrate 10.

As already explained in the foregoing, the magnetic field H serves to increase the density of the electrons (and consequently of the ions) in the vicinity of the target in order to increase the sputtering rate.

It is readily apparent that the field $\vec{H}$ need not be produced by permanent magnets but may also be produced by solenoid coils.

In the case of the bias sputtering technique and systems of the "ion plating" type, the substrate 10 is biased at a negative potential with respect to the anode. In this case the substrate receives a larger quantity of ions than in the device in which the substrate is at the same potential as the anode and which can also be employed. Biasing is performed by means of the voltage supply 17. The bias voltage is 5 kilovolts in the case of "ion plating" and is 50 to 1000 V in the case of bias sputtering devices.

Figure 2A:
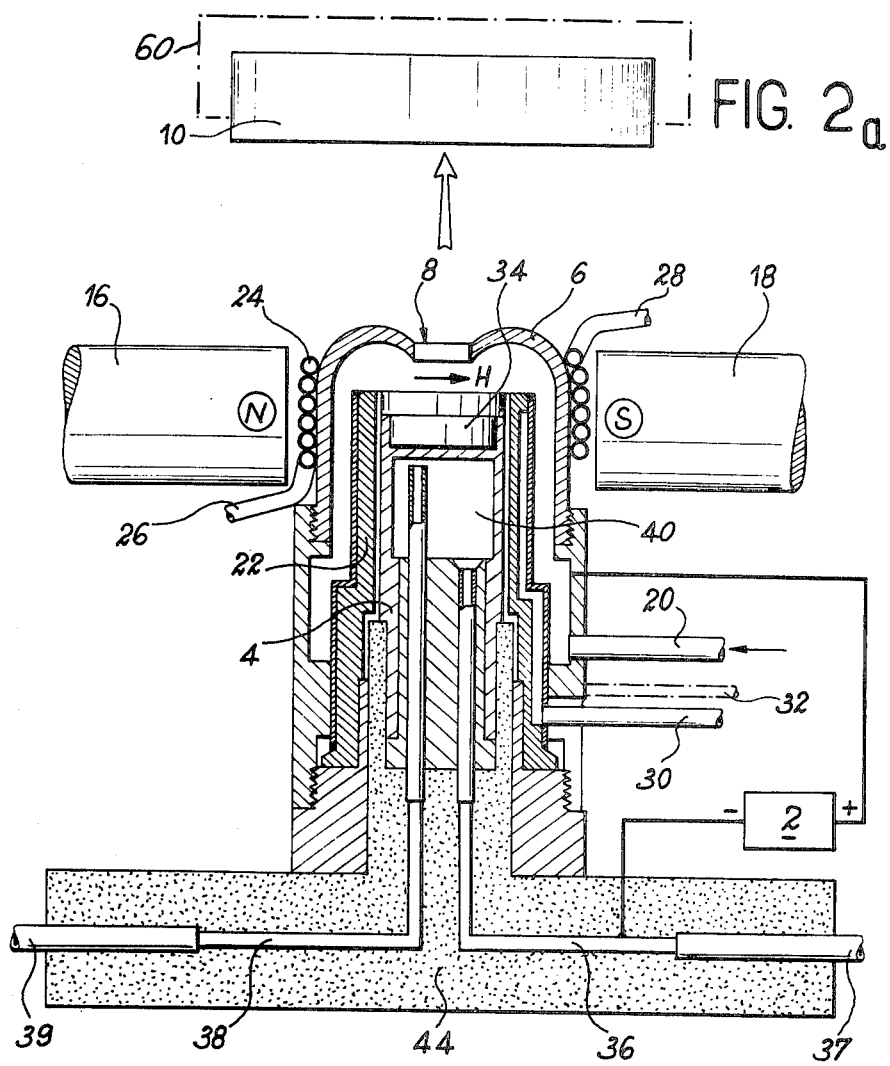
FIG. 2a is a more detailed diagram of a sputtering device in accordance with the invention.

In FIG. 2a, there is shown an industrial form of construction of the device in accordance with the invention. The elements which are identical with those of FIG. 1 are designated by the same references. In this embodiment, the anode has the configuration shown at 6, that is to say a shape of nozzle designed to improve both the projection of sputtered materials towards the substrate 10 and the characteristics of discharge between anode 6 and target 34.

Figure 2B:
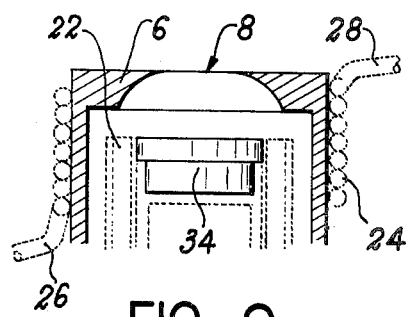
FIGS. 2b and 2c show two alternative forms of nozzles employed in the same sputtering device.
Figure 2C:
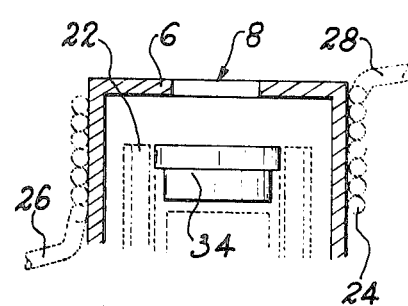

Other forms of anodes are also employed as illustrated in FIGS. 2b and 2c. The anode of FIG. 2b is preferentially employed when it is found desirable to limit the removal of material at the center of the target. In addition to the different elements shown in FIG. 1, the device of FIG. 2 provides for circulation of coolant fluid 24 which is employed for the purpose of cooling the anode, the fluid being admitted through the pipe 26 for subsequent discharge through the pipe 28 and circulated within a pipe coil around the external wall of the anode, a second cooling system for the suppressor screen in which the fluid is admitted through the pipe 30 to be discharged through the pipe 32 which is parallel to the pipe 30, and a third cooling system for cooling the cathode 4 which constitutes the target (the material constituting the target can be deposited in the container 34 which is located within the interior of the cathode, forms part of the cathode and is at the same potential), this circulation of fluid being admitted through the pipe 36 and subsequently discharged through the pipe 38 after circulating within the container 40.

The fluid admission pipes 36 and 38 are insulated with respect to the anode by means of the material 44 and with respect to ground by means of polyethylene pipes 37 and 39. In the device shown in FIG. 2a, the anode 6 and the suppressor screen 22 can be disassembled in order to ensure that the target can readily be replaced. By making provision for three separate cooling circuits, the temperatures of the target 4, of the anode 6 and of the suppressor screen 22 can be regulated independently.

It is also an advantage to provide means for checking the temperature of the substrate, either in order to heat the substrate and perform an annealing operation on the sputtered and deposited films or in order to cool and to obtain amorphous films on the substrate. These temperature-regulating means are shown diagrammatically at 60.

The high deposition rate arises from a number of characteristic features:

the existence of a high pressure gradient $\Delta p$ of the gas employed for the sputtering process, the pressure of the gas being of high value in the immediate vicinity of the target: this makes it possible to obtain a plasma having high intensity near the target but low intensity in the vicnity of the substrate, with the result that the plasma has low absorptive capacity for the sputtered particles;

the presence of a magnetic field parallel to the target in the vicinity of this latter;

the position of the suppressor screen 22 placed very close to the cathode and to the periphery of the target makes it possible to suppress lateral sputtering. Thus the quantity of material deposited on the anode 6 is relatively small compared with the quantity collected on the substrate 10. The suppressor makes it possible in addition to sputter only the target and therefore to increase the purity of material collected on the substrate.

As can readily be understood, the deposition rate is dependent on the atomic mass of the gas employed: as this latter is of higher value, so the deposition rate is higher. Argon can advantageously be employed for this purpose. FIGS. 3 to 6 give the results obtained with a stainless steel target having a diameter of 20 mm placed at a distance of 8 mm from the anode. The anode aperture has a diameter of 11 mm. The distance between substrate and anode is 40 mm.

FIGS. 3 to 6 give the deposition rates as a function of the parameters indicated. The deposition rates are measured with a quartz oscillator.

Figure 3:
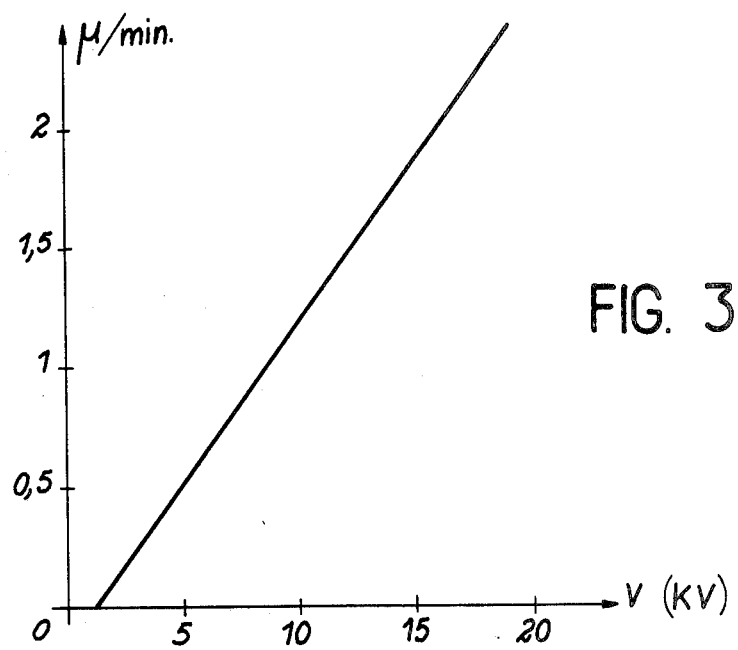
FIG. 3 shows the thickness deposited on the substrate per unit of time as a function of the voltage between anode and cathode.

The curve shown in FIG. 3 indicates the variation of thickness disposited per unit of time (in microns per minute) as a function of the anode/cathode voltage expressed in kV. This curve has been plotted for a ratio equal to 90 between the gas inlet pressure P (argon) and the gas pressure $p$ in the vicinity of the substrate, the pressure $p$ being equal to 2 millitorrs and with a magnetic field H of 2 kilogauss.

The thickness deposited per unit of time increases linearly with the voltage between the target-cathode and the anode but a high voltage entails a high current and gives rise to considerable cooling problems. A voltage between the anode and the cathode within the range of 5 to 10 kV is reasonable and effective for continuous operation of the device.

The pressure P can vary between 100 and 500 millitorrs and the pressure $p$ can vary between 1 and a few militorrs. The diameter of the target is not of major importance; it serves no useful purpose to adopt a target of unduly large size since the angle of discharge through the aperture 8 then becomes too small and the sputtered material fouls the internal surface of the anode 6 (FIG. 2). The ratio between the diameter of the target 4 and the diameter of the aperture 8 of the anode is usually between 2.5 and 1.3. The distance $d$ between the target and the anode varies between 3 or 4 mm and 20 or 25 mm. As the distance from the anode increases, the solid angle which subtends the substrate at the target becomes smaller; and as the distance to be traversed by the sputtered particles in a gas at high pressure increases, the absorption increases. However, if the distance $d$ is too small, the plasma does not form or has low intensity. The distance between the substrate and the anode is not critical. As the substrate is closer to the anode, the quantity of material collected is larger but heat build-up of the substrate rises to a corresponding extent. It is an advantage to place said substrate at a distance of a few centimeters from the anode.

Figure 4:
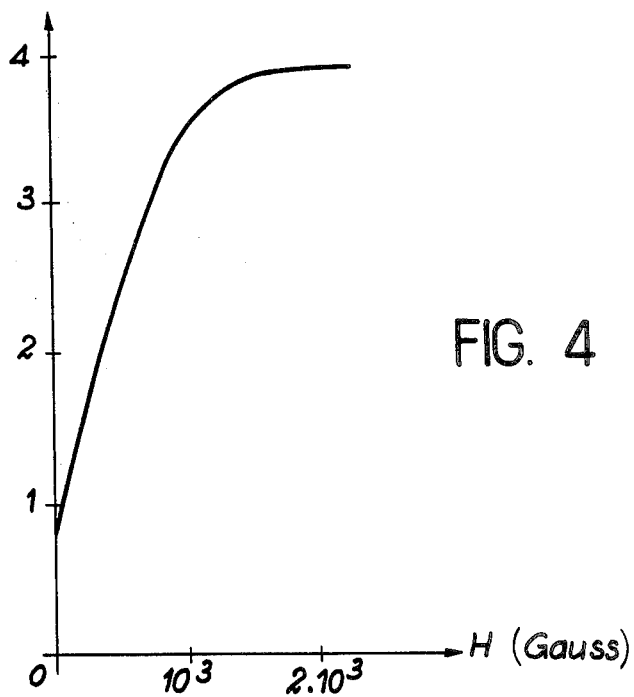
FIG. 4 shows the thickness deposited per unit of time as a function of the magnetic field in Gauss in the vicinity of the target.

There is shown in FIG. 4 the thickness deposited per unit of time (arbitrary unit) as a function of the magnetic field in Gauss at a cathode voltage of 5 kilovolts. The pressure P is equal to 180 millitorrs and the pressure $p$ is equal to 2 millitorrs. A magnetic field higher than 1.2 kilogauss would not achieve any better result so far as the deposition rate is concerned.

Figure 5:
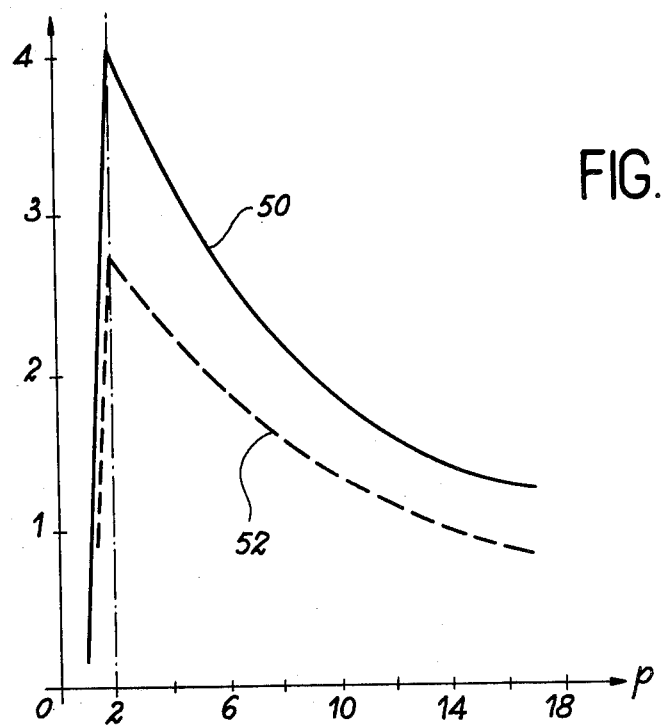
FIG. 5 shows the thickness deposited per unit of time as a function of the pressure $p$ in the vicinity of the substrate.

In FIG. 5, the thickness deposited on the substrate per unit of time (arbitrary unit) is shown as a function of the pressure $p$ in millitorrs. The pressure P is equal to 175 millitorrs. The curve 50 has been plotted with an anode-cathode potential difference of 5 kilovolts; all other parameters being equal, the curve 52 has been plotted with an anode-cathode voltage of 3 kilovolts. In this case, the magnetic field H has a value of 2.2 kilogauss. It can be seen that there is a very distinct maximum value of thickness deposited per unit of time in respect of a pressure $p$ within the enclosure in the vicinity of the substrate of the order of 2 millitorrs.

Practical experiments have shown that it was particularly advantageous to set the value of the radius of precession of the electron at a value either lower than or of the order of one-half millimeter.

Figure 6:
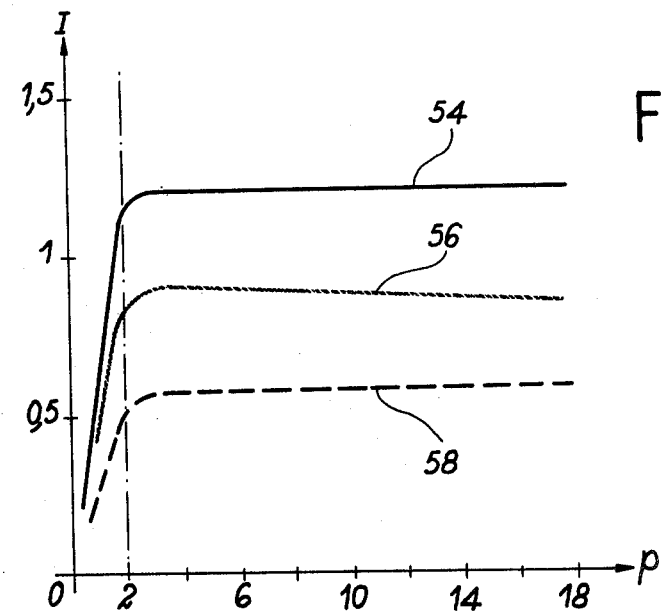
FIG. 6 shows the intensity of the anode current as a function of the pressure $p$ in the vicinity of the substrate.

In FIG. 6, the anode current expressed in arbitrary units is shown as a function of the pressure $p$ of the gas in the vicinity of the substrate. The curve 54 has been plotted for a potential difference of 5 kilovolts between the anode and the cathode, the curve 56 for 4 kilovolts and the curve 58 for 3 kilovolts. A relatively constant anode current is observed above a gas pressure of 2 millitorrs in the vicinity of the substrate. As in the case illustrated in FIG. 5, the pressure of introduction of the gas (argon) is 175 millitorrs.

The device in accordance with the invention makes it possible to sputter all the conventional materials employed in the sputtering devices of the prior art. Steel, tungsten carbide, tantalum carbide can be mentioned by way of nonlimitative examples. These materials are employed as coatings in micromechanics and in hardening of tools but other applications such as the fabrication of contacts in microelectronics or deposits on plastics can also be contemplated.

We claim:

1. A device for cathodic sputtering at a high deposition rate on a substrate comprising :

a pumped enclosure adapted to be at a low pressure $p$ less than atmospheric pressure ;

a cup-shaped anode within said enclosure, said anode having a circular bottom portion including a centered orifice;

a target within said enclosure, said target being positioned within said cup-shaped anode and having a single, flat sputtering surface defined by a perimetric edge, said surface being parallel to, opposed to, and spaced from said bottom portion;

means for providing a plasma creating electrical discharge between said target and said anode, said target being at a negative potential relative to said anode;

conduit means for admitting a gas at a high pressure P higher than said low pressure $p$ into the space between said sputtering surface of said target and said bottom portion of said anode;

means within said enclosure for holding said substrate outside of said cup-shaped anode, said substrate being opposed to and spaced from said orifice, communication between said sputtering surface and said substrate being established solely via said orifice, a high gas-pressure gradient P-$p$ being established between said sputtering surface and said substrate;

means located externally of said anode for producing a magnetic field H of at least a kilogauss parallel to said sputtering surface of said target, said parallel magnetic field being substantially confined to the space between said sputtering surface and said bottom portion of said cup-shaped anode;

a suppressor screen place around said perimetric edge of said sputtering surface and spaced equidistantly therefrom, said suppressor screen around said perimetric edge being within said cup-shaped anode; and means for bringing said substrate to a negative potential with respect to said anode wherein plasma is created by an arc imposed by static electrical potentials applied between said substrate and said anode.

* * * * *